United States Patent
Lee et al.

[11] Patent Number: 6,037,215
[45] Date of Patent: Mar. 14, 2000

[54] FABRICATING METHODS INCLUDING CAPACITORS ON CAPPING LAYER

[75] Inventors: Joo-young Lee; Ki-nam Kim, both of Kyungki-do, Rep. of Korea

[73] Assignee: Samsung Electronics Co., Ltd., Rep. of Korea

[21] Appl. No.: 09/152,582

[22] Filed: Sep. 14, 1998

Related U.S. Application Data

[62] Division of application No. 08/876,870, Jun. 16, 1997, Pat. No. 5,895,947.

[30] Foreign Application Priority Data

Jul. 29, 1996 [KR] Rep. of Korea .................. 96-31313

[51] Int. Cl.[7] .............................................. H01L 21/8242
[52] U.S. Cl. ............................................................ 438/253
[58] Field of Search ................................. 438/238–241, 438/250–256, 381, 393–399

[56] References Cited

U.S. PATENT DOCUMENTS

| | | | |
|---|---|---|---|
| 5,744,833 | 4/1998 | Chao | 257/308 |
| 5,851,873 | 12/1998 | Murai et al. | 438/253 |
| 5,872,018 | 2/1999 | Lee | 438/253 |

OTHER PUBLICATIONS

Yoon et al., "A New Capacitor on Metal (COM) Cell for Beyond 256 Mbit DRAM", 1994 Symposium on VLSI Technology Digest of Technology Papers, 1994, pp. 135–136.

*Primary Examiner*—Jey Tsai
*Attorney, Agent, or Firm*—Myers Bigel Sibley & Sajovec

[57] ABSTRACT

Integrated circuit memory devices are fabricated by forming a first contact hole in a cell array region and a second contact hole in a peripheral circuit region. Conductive material is simultaneously placed in the first and second contact holes such that the conductive material in the first contact hole electrically contacts a memory cell transistor in the cell array region and the conductive material in the second contact hole electrically contacts the peripheral circuit transistor in the peripheral circuit region. A capping layer is included, and the peripheral circuit region wiring layer and the capacitor storage electrode is formed directly on the capping layer. Improved performance and reduced step height may thereby be obtained.

14 Claims, 8 Drawing Sheets

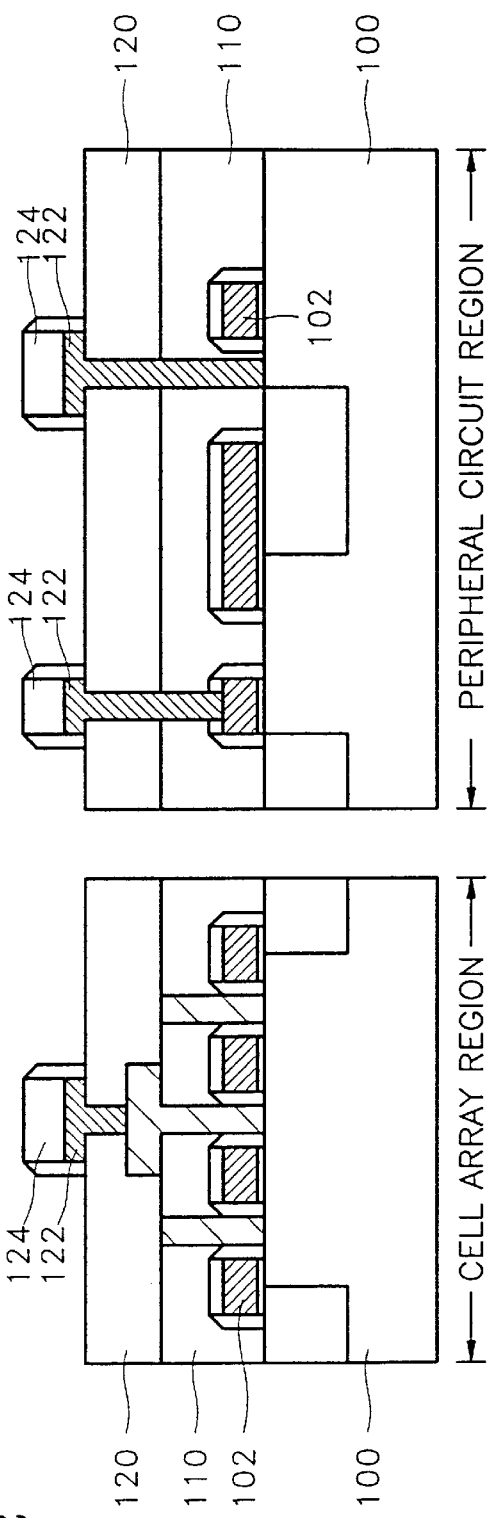
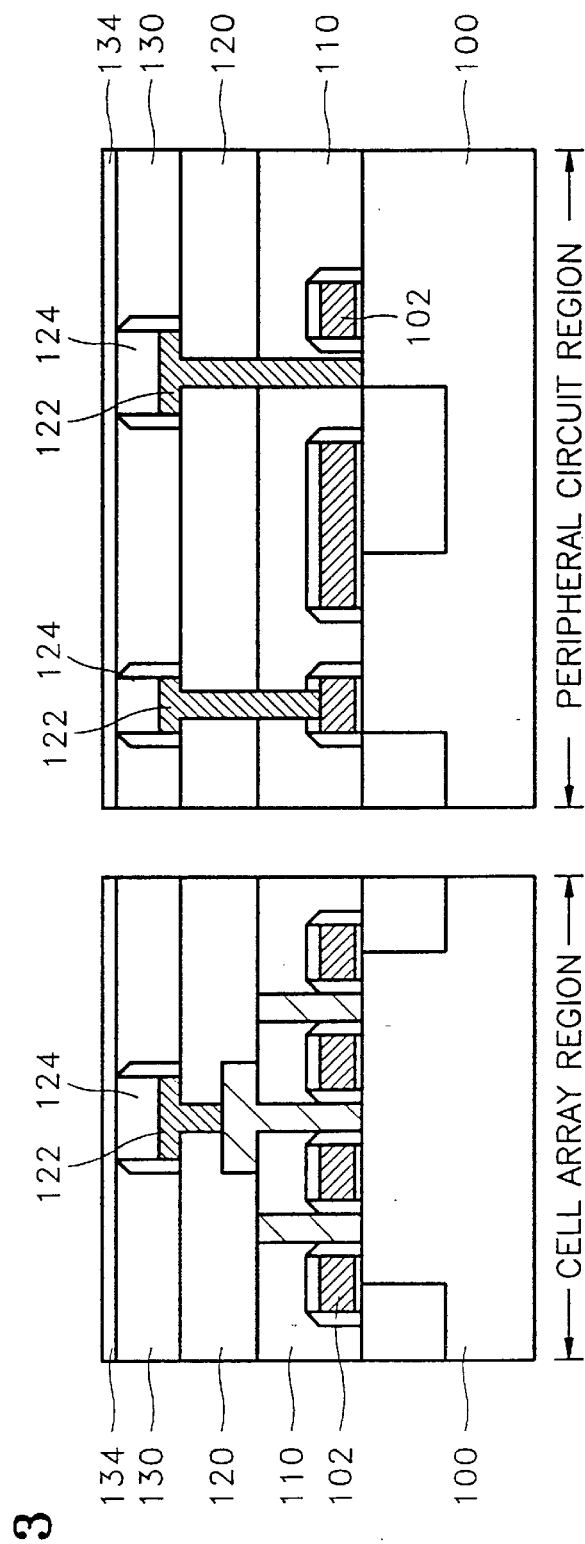

FABRICATING METHODS INCLUDING CAPACITORS ON CAPPING LAYER

This application is a divisional of Ser. No. 08/876,870, filed Jun. 16, 1997, now U.S. Pat. No. 5,895,947.

FIELD OF THE INVENTION

This invention relates to integrated circuit devices and fabricating methods, and more particularly to integrated circuit memory devices and fabricating methods including capacitors.

BACKGROUND OF THE INVENTION

Integrated circuit memory devices are widely used in consumer and commercial applications. As is well-known to those have skill in the art, many integrated circuit memory devices include active devices such as transistors, and capacitors for storing data. As is also well-known, the integration density of integrated circuit memory devices has increased, so that more and more integrated circuit memory cells may be formed in an integrated circuit chip.

In general, as the number of devices formed on a chip increases, the size of the devices tends to shrink. For example, 1 GB DRAM cells which include a transistor and a capacitor, may have an area on an integrated circuit of about 0.3 $\mu m^2$. This is about the area of a single contact hole in a 1 MB DRAM cell. Accordingly, it is desirable to reduce the area of the transistors, the capacitors and the contact holes in order to produce high capacity memory cells, such as a 1 GB DRAM cell.

State-of-the-art memory cells may employ three-dimensional cell structures, so that the contact holes, the capacitor and the transistor can be included in a small area. Since these three-dimensional cells may be scaled down in the lateral dimension, more cells can be crammed in an integrated circuit. Unfortunately, however, since the scale-down in the vertical direction is typically not large, the aspect ratio of the contact holes which are used to interconnect memory devices in the integrated circuit may increase. The resistance of the contacts may thereby increase, which may limit the device performance.

Other developments in high density memory devices attempt to increase the capacitance per unit area by providing a high dielectric material or by providing a three-dimensional capacitor structure. For example, it is known to use a Capacitor Over Bitline (COB) structure, wherein it is possible to obtain high capacitance in a limited area by forming a bitline and then forming the cell capacitor on the bitline.

FIG. 1 is a cross-sectional view of a portion of a conventional DRAM device employing a COB structure. The DRAM device includes a cell array region at the right side of FIG. 1 and a peripheral circuit region at the left side of FIG. 1.

As shown in FIG. 1, a capacitor is formed by forming a storage contact hole through a first interlayer dielectric 20 on an integrated circuit substrate 10 on which a word line 12 is formed. A storage electrode 24 is then formed to electrically contact the storage contact. A dielectric film 26 is formed on the storage electrode 24 and a plate electrode 28 is formed on the dielectric film 26. In the capacitor, the storage contact and the storage electrode 24 may be formed at the same time. The storage contact may include a plug which is formed of a doped polysilicon layer, which is the same as the material for forming the storage electrode.

Continuing with the description of FIG. 1, after providing a second interlayer dielectric film 30 on the capacitor and forming a contact hole through the second interlayer dielectric film and the first interlayer dielectric film 20, a first wiring layer 32 is formed. The first wiring layer 32 may be formed of a refractory metal such as tungsten, and is generally used as a first level interconnect wiring layer. A second wiring layer 34 and a third wiring layer 36 may then be formed by conventional processes, using appropriate interlayer dielectric films.

Unfortunately, as shown in FIG. 1, a memory device employing a COB structure may produce a step height between the cell array region (at the right side of FIG. 1) and the peripheral circuit region (at the left side of FIG. 1). This step height may become larger when the height of the storage electrode 24 is increased in order to increase the capacitance of the capacitor. As such, it may be difficult to reliably fabricate the first, second and third metal wiring layers 32, 34 and 36 respectively, to overcome the step height difference.

Capacitor On Metal (COM) memory devices have also been proposed, among other reasons, to overcome the potential step height problems. In a COM structure, the capacitor is formed on a first level metal wiring layer. A COM memory device is described in a publication entitled "A New Capacitor on Metal (COM) Cell for Beyond 256 Mega Bit DRAM" by Yoon et al., 1994 Symposium on VLSI Technology Digest of Technical Papers, pp. 135–136. In the Yoon et al. publication, it is possible to reduce the vertical pitch of the metal wiring layer and yet still secure the desired cell capacitance. However, as the integration density of integrated circuit memory devices continues to increase, additional improvements are desirable.

SUMMARY OF THE INVENTION

It is therefore an object of the present invention to provide improved integrated circuit memory devices and fabricating methods.

It is another object of the present invention to provide integrated circuit memory devices and fabricating methods, including three-dimensional capacitor structures.

It is still another object of the present invention to provide integrated circuit memory devices and fabricating methods which can reduce step height differences between the peripheral circuit region and the cell array region thereof.

These and other objects are provided, according to the present invention, by fabricating a capacitor storage electrode and a wiring layer directly on a capping layer in respective peripheral circuit regions and cell array regions of an integrated circuit memory device. Prior to forming the capping layer, first and second contact holes are preferably formed in the cell array region and in the peripheral circuit region, respectively, through the capping layer. Conductive material is simultaneously placed in the first and second contact holes. Simplified manufacturing processes and reduced step height structures may thereby be provided.

In a preferred embodiment of the present invention, an integrated circuit memory device is fabricated by forming a plurality of memory cell transistors and a plurality of peripheral circuit transistors in a cell array region and in a peripheral circuit region, respectively, of an integrated circuit substrate. A bit line is formed on the integrated circuit substrate. The bit line is electrically connected to at least one of the memory cell transistors. A first capping layer is formed on the bit line. A first interlayer dielectric film is formed on the integrated circuit substrate, including on the cell array region and on the peripheral circuit region. The first interlayer dielectric film exposes the first capping layer on the bit line.

A second capping layer is formed on the first capping layer and on the first interlayer dielectric film. A first contact hole and a second contact hole are formed in the cell array region and in the peripheral circuit region, respectively. Conductive material is simultaneously placed in the first and second contact holes. The conductive material in the first contact hole electrically contacts a memory cell transistor in the cell array region. The conductive material in the second contact hole electrically contacts a peripheral circuit transistor in the peripheral circuit region.

A wiring layer is formed on the second capping layer, electrically connected to the conductive material in the second contact hole. A second interlayer dielectric film is formed on the wiring layer. A capacitor storage electrode is formed on the conductive material on the first contact hole. A capacitor dielectric film is formed on the capacitor storage electrode and a capacitor plate electrode is formed on the capacitor dielectric film.

The first interlayer dielectric film and the first capping layer preferably comprise materials having different etch rates. Also preferably, the second capping layer and the second interlayer dielectric film comprise materials having different etch rates. Particularly, the first capping layer may comprise nitride and the first interlayer dielectric film may comprise oxide. The second capping layer preferably comprises nitride and the second interlayer dielectric film preferably comprises oxide. The conductive material is preferably tungsten or TiN.

Preferably, the conductive material is formed on the second capping layer as well, and the capping layer is formed by patterning the conductive material on the second capping layer. The second interlayer dielectric film may be formed by forming an oxide film on the integrated circuit substrate including on the cell array region and on the peripheral circuit region, and removing the oxide film from the cell array region using the second capping layer as an etch stop. The first interlayer dielectric film may be formed by forming an oxide film on the integrated circuit substrate including on the cell array region and on the peripheral circuit region. The oxide film is then planarized to expose the first capping layer on the bit line.

Integrated circuit memory devices according to the present invention include an integrated circuit substrate, and a plurality of memory cell transistors and a plurality of peripheral circuit transistors in a cell array region and in a peripheral circuit region, respectively, of the integrated circuit substrate. At least one interlayer dielectric film is included on the integrated circuit substrate, including on the cell array region and on the peripheral circuit region. The at least one interlayer dielectric film includes a bit line electrically connected to at least one of the memory cell transistors. A capping layer is included on the at least one interlayer dielectric film. A wiring layer is included directly on the capping layer, electrically connected to a peripheral circuit transistor in the peripheral circuit region. A capacitor storage electrode is included directly on the capping layer, electrically connected to a memory cell transistor in the cell array region. A capacitor dielectric film is included on the capacitor storage electrode, and a capacitor plate electrode is included on the capacitor dielectric film.

Memory devices according to the present invention may also include a first contact hole in the cell array region and a second contact hole in the peripheral region, extending through the capping layer. Conductive material may be included in the first and second contact holes, such that the conductive material in the first contact hole electrically contacts a memory cell transistor in the cell array region and the conductive material in the second contact hole electrically contacts a peripheral circuit transistor in the peripheral circuit region. The wiring layer preferably is electrically connected to the conductive material on the second contact hole, and the capacitor storage electrode is preferably electrically connected to the conductive material in the first contact hole.

The capping layer preferably is a planar capping layer and preferably comprises nitride. The at least one interlayer dielectric film preferably comprises oxide.

Accordingly, it is possible to simplify the integrated circuit memory device fabrication process and to reduce the step height between the cell array region and the peripheral circuit region. Reduced contact resistance may also be provided.

BRIEF DESCRIPTION OF THE DRAWINGS

FIGS. 2–8 are cross-sectional views illustrating steps for fabricating integrated circuit memory devices according to the present invention.

DETAILED DESCRIPTION OF PREFERRED EMBODIMENTS

Figure 1:
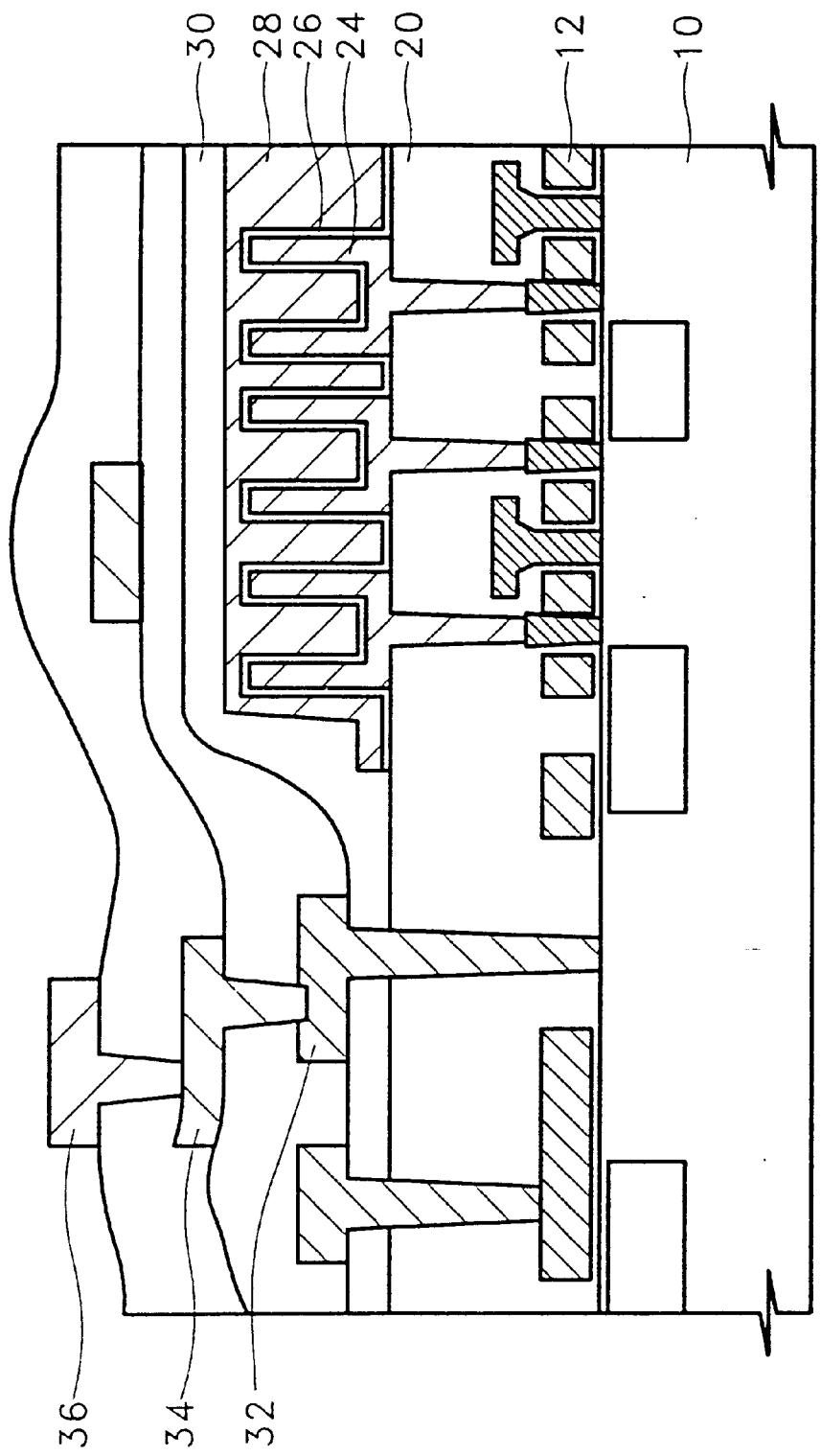
FIG. 1 is a cross-sectional view schematically illustrating a conventional integrated circuit memory device including a Capacitor Over Bitline (COB) structure.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will also be understood that when a layer is referred to as being "on" another layer or substrate, it can be directly on the other layer or substrate, or intervening layers may also be present. Conversely, when a layer is indicated as being formed "directly on" another layer or substrate, no intervening layers are present.

FIG. 2 shows the steps of forming a bit line 122 and a first capping layer 124 on an integrated circuit substrate 100 such as a semiconductor substrate. The first capping layer 124 covers the bit line 122. The bit line 122 is formed as a first conductive layer connected to an active region of the semiconductor substrate 100 through interlayer dielectric films 110 and 120 on the substrate 100 on which cell array devices 102 such as cell array transistors are formed. A first insulating layer is then formed on the entire surface of the resultant structure using a first insulating material such as $Si_3N_4$. The first insulating material is anisotropically etched to form first capping layer 124.

FIG. 3 shows the steps of forming a first interlayer dielectric film 130 and a second capping layer 134. The first interlayer dielectric film is formed by forming an insulating film such as an oxide film by chemical vapor deposition (CVD) on the entire surface of the resultant structure using a second insulating material having an etch rate different from that of the first insulating material. The oxide film 130 is planarized by a chemical mechanical polishing (CMP) process with the first capping layer 124 acting as an etch stop layer. The second capping layer 134 is formed by forming a second insulating layer on the entire surface of the resultant structure using a third insulating material such as $Si_3N_4$. As shown, the second capping layer 134 is preferably planar.

Figure 4:
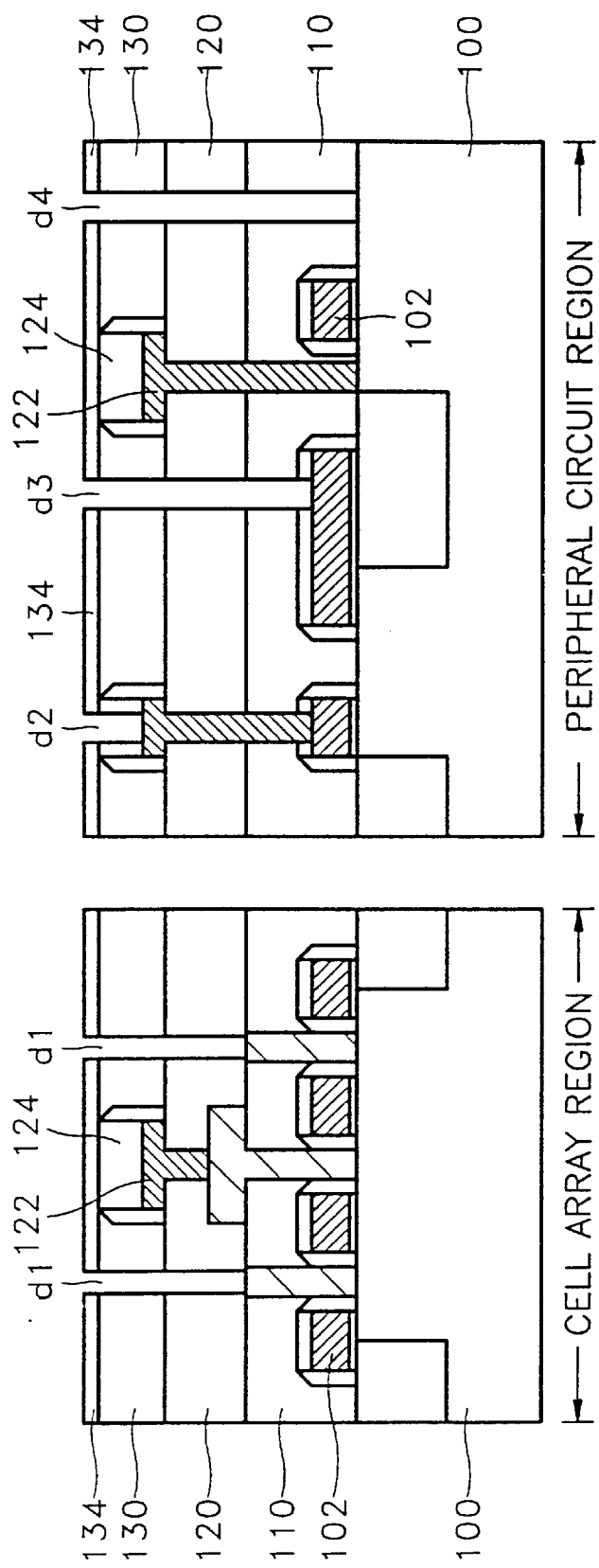

FIG. 4 shows the steps of forming a contact hole d1 for forming a storage contact to a cell array region, and forming contact holes d2, d3 and d4 for a metal contact to a peripheral circuit region. These contact holes are preferably formed simultaneously, using photolithography. The contact hole d1 for forming the storage contact is electrically connected to the active region of a memory cell transistor in the cell array region of FIG. 3. The contact holes d2, d3 and d4 form metal contacts for partial interconnection to peripheral circuit transistors in the peripheral circuit region.

Figure 5:
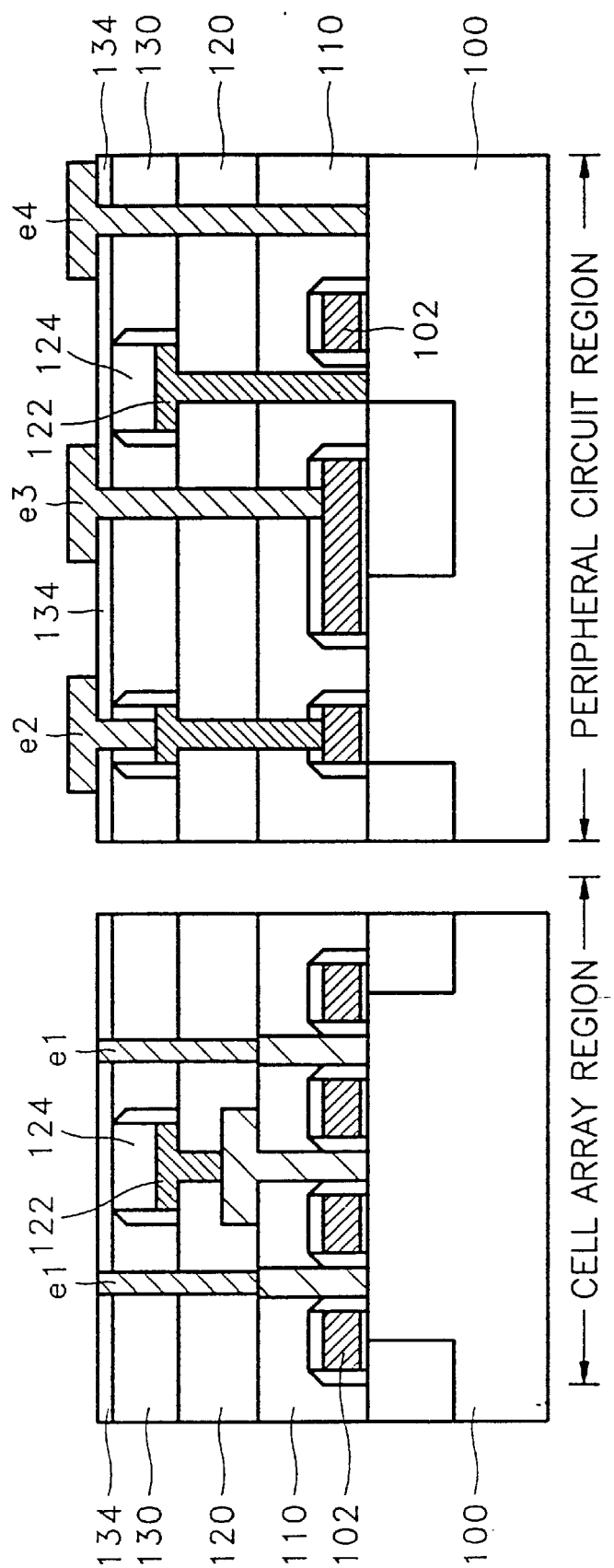

FIG. 5 shows the steps of forming a plug e1 for forming the storage contact of the cell array region and forming wiring layers e2, e3 and e4 of the peripheral circuit region. In particular, a second conductive layer is formed by depositing a metal having excellent filling properties, for example, tungsten (W) or TiN, using CVD. The metal preferably fills the contact holes d1, d2, d3 and d4 which were opened in FIG. 4. The plug e1 for forming the storage contact is formed in the contact hole d1 in the cell array region by etching back the second conductive layer using photolithography. The wiring layers e2, e3 and e4 are formed on the upper portions of the contact holes d2, d3 and d4 by patterning the second conductive layer in the peripheral circuit region. As is well known, the wiring layers e2, e3 and e4 may be used for local interconnections.

It is possible to increase the depth of focus (DOF) margin during the photolithography process for forming the wiring layers e2, e3 and e4 and to reduce over-etching of the second conductive layer in the step portion, compared to a conventional method when the second conductive layer formed of a metal is etched, since the degree of planarization of the first interlayer dielectric film 130 is improved using the CMP process as described with reference to FIG. 3. Therefore, it is possible to prevent the surface of the plug e1 formed in the contact hole of the cell array region from being recessed by over-etching.

Figure 6:
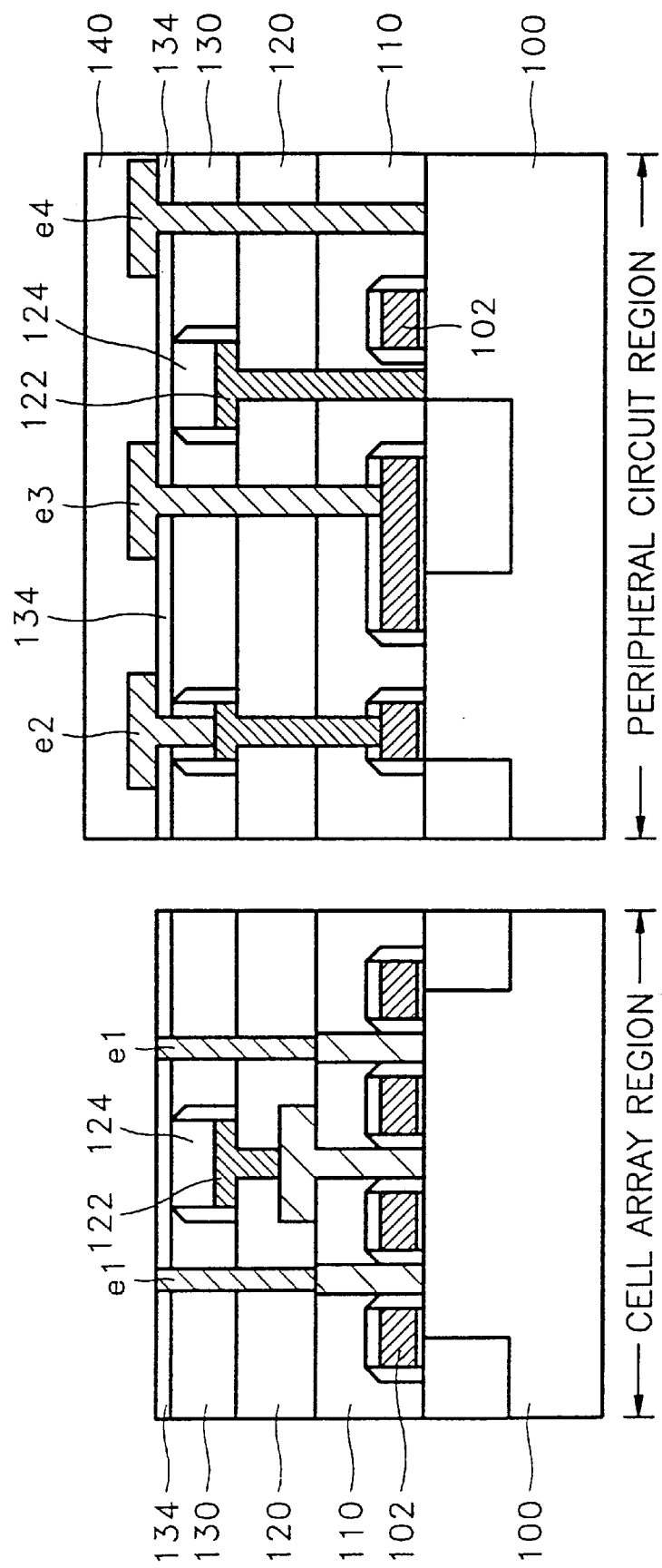

FIG. 6 shows the steps of forming a second interlayer dielectric film 140 only in the peripheral circuit region. The second interlayer dielectric film 140 is formed by forming an insulating film such as an oxide film on the entire surface of the resultant structure of FIG. 5, and removing the insulating film by etching the insulating film in the cell array region using the second capping layer 134 as an etch stop layer. Thus, the upper surface of the plug e1 is exposed in the cell array region.

Figure 7:
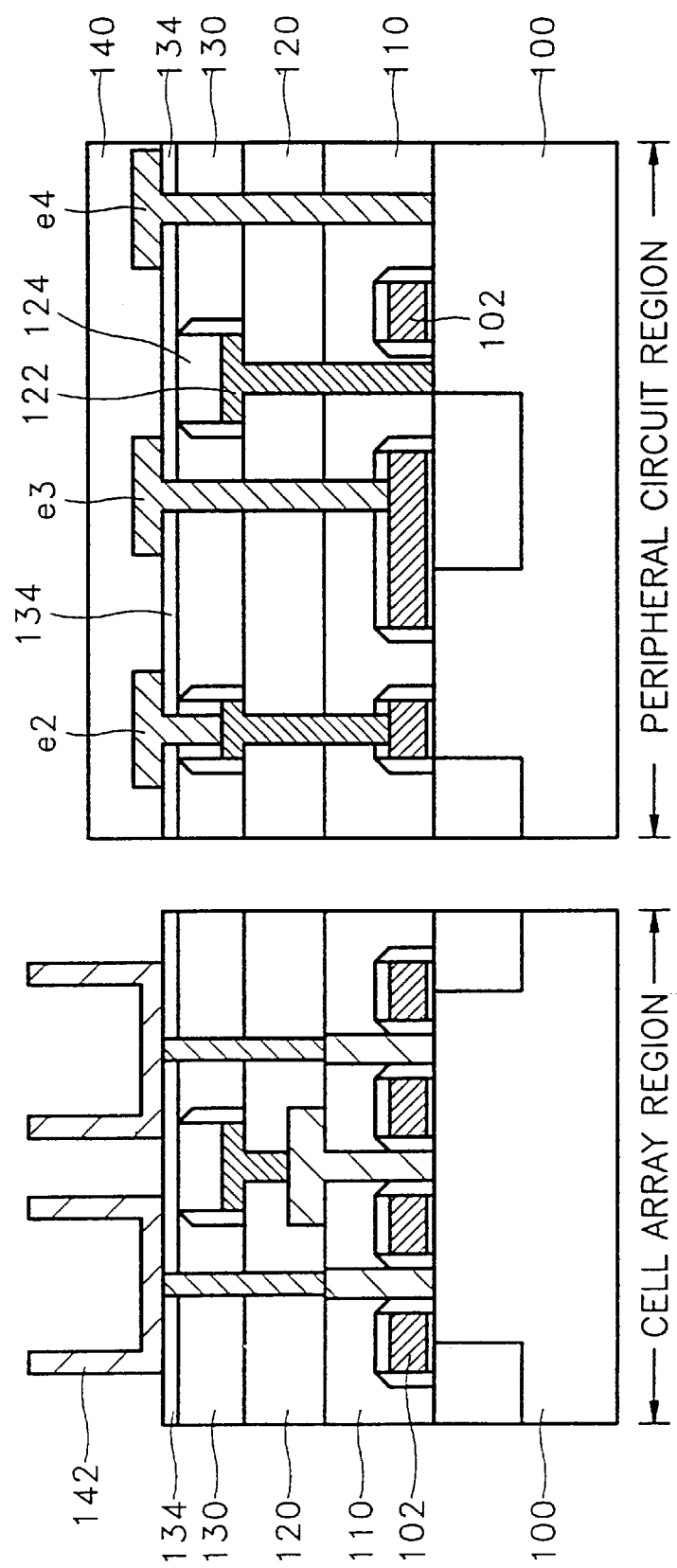

FIG. 7 shows the steps of forming a storage electrode. The storage electrode 142 is formed to electrically connect to the active region of the substrate 100 through the plug e1 by forming a conductive layer such as a doped polysilicon layer in the cell array region of the resultant structure of FIG. 6 and patterning the conductive layer. It is also possible to form a storage electrode having a structure in which a TiN film and a polysilicon layer are stacked by forming the TiN film and the polysilicon layer and patterning the TiN film and polysilicon layer.

In FIG. 7, the storage electrode 142 is formed in a One Cylinder Stack (OCS) structure. However, the present invention is not restricted to such a structure and a simple stack structure or other structures may be employed.

Figure 8:
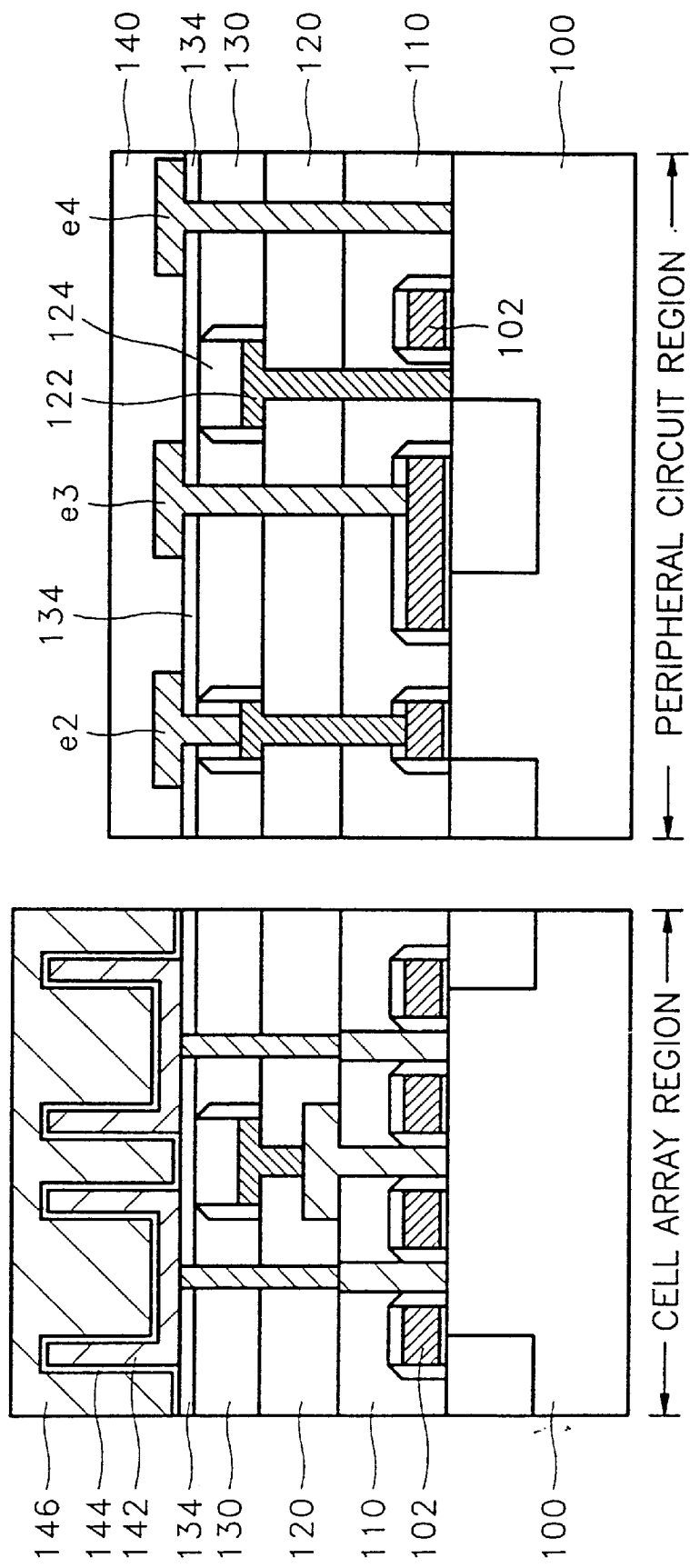

FIG. 8 shows the steps of completing the capacitor. The capacitor is completed by forming a dielectric film 144, of a dielectric material such as $Ta_2O_5$ and $(Ba, Sr)TiO_3$, on the surface of the storage electrode 142 in the cell array region, and forming a plate electrode 146 on the dielectric film 144.

Then, the overall structure of the memory device is completed using conventional processes for forming contacts and wiring. In subsequent steps, since the capacitor is formed in the cell array region and the wiring layers for forming the local interconnection are formed in the regions excluding the cell array region, it is possible to reduce the step height between the cell array region and the peripheral circuit region and to increase the process margins when the contact and metal wiring layers are formed.

Figure 9:
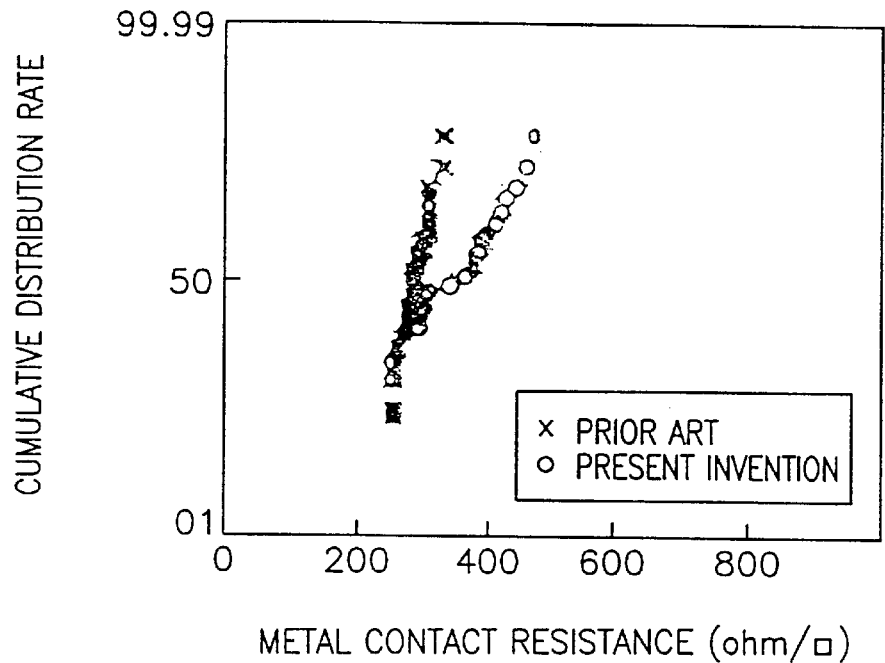
FIG. 9 graphically illustrates the contact resistance of a metal wiring layer manufactured according to the present invention compared with that of a metal wiring layer manufactured according to conventional technology.

FIG. 9 is a graph showing cumulative distribution rates of the contact resistances in the first level metal wiring layer corresponding to the wiring layers e2, e3 and e4 of FIG. 5 and a conventional first metal wiring layer corresponding to the first wiring layer 32 of FIG. 1. As shown in FIG. 9, when forming the storage contact of the cell array region and the metal wiring layer of the peripheral circuit region at the same time according to the present invention, the contact resistance of the metal wiring layer is substantially equal to the contact resistance by the conventional technology. Therefore, it is possible to simplify the process by maintaining the same contact resistance in the metal wiring layer, and by eliminating the photolithography process required for forming the metal wiring layer.

Figure 10:
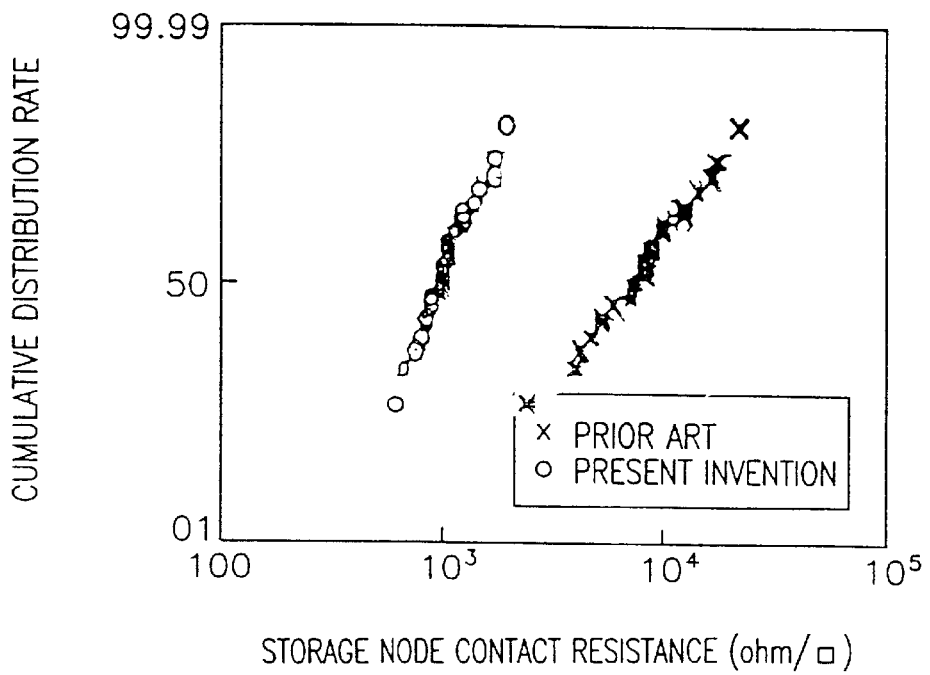
FIG. 10 graphically illustrates contact resistance of a storage contact in an integrated circuit memory device manufactured according to the present invention compared with that of the storage contact of a conventional integrated circuit memory device.

FIG. 10 shows the cumulative distribution rates of the contact resistance of the storage contact in devices according to the present invention and the contact resistance of the storage contact in conventional devices. As shown in the graph of FIG. 10, with the storage contact formed of a polysilicon plug being replaced by a tungsten plug according to the present invention, the contact resistance is reduced by one order of magnitude compared with the contact resistance in the storage contact of a conventional device.

According to the present invention, it is possible to reduce the contact resistance by using a plug formed of a metal instead of a conventional plug formed of polysilicon to form the storage contact. It is also possible to reduce the step height between the cell array region and the peripheral circuit region in the process for forming the metal wiring layer after the step of forming the storage electrode of the cell array region, by forming the storage contact and the metal wiring layer in the peripheral circuit region simultaneously, before forming the storage electrode in the cell array region. Accordingly, subsequent processes are facilitated.

Therefore, according to the present invention, it is possible to reduce process margins and to manufacture devices having low contact resistance with simplified manufacturing processes. The step height between the cell array region and the peripheral circuit region also can be reduced by simultaneously forming the first level metal wiring layer and the storage contact of the capacitor in the semiconductor device.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of fabricating an integrated circuit memory device comprising the steps of:

forming a plurality of memory cell transistors and a plurality of peripheral circuit transistors in a cell array region and in a peripheral circuit region, respectively, of an integrated circuit substrate;

forming a bit line on the integrated circuit substrate, the bit line being electrically connected to at least one of the memory cell transistors;

forming a first capping layer on the bit line;

forming a first interlayer dielectric film on the integrated circuit substrate, including on the cell array region and on the peripheral circuit region, the first interlayer dielectric film exposing the first capping layer on the bit line;

forming a second capping layer on the first capping layer and on the first interlayer dielectric film;

forming a first contact hole in the cell array region and a second contact hole in the peripheral circuit region;

simultaneously placing conductive material in the first and second contact holes, such that the conductive material in the first contact hole electrically contacts a memory cell transistor in the cell array region and the conductive material in the second contact hole electrically contacts a peripheral circuit transistor in the peripheral circuit region;

forming a wiring layer on the second capping layer, electrically connected to the conductive material in the second contact hole;

forming a second interlayer dielectric film on the wiring layer;

forming a capacitor storage electrode on the conductive material on the first contact hole;

forming a capacitor dielectric film on the capacitor storage electrode; and forming a capacitor plate electrode on the capacitor dielectric film.

2. A method according to claim 1 wherein the step of simultaneously placing conductive material further comprises the step of forming conductive material on the second capping layer; and wherein the step of forming a wiring layer comprises the step of patterning the conductive material on the second capping layer.

3. A method according to claim 1 wherein the first interlayer dielectric film and the first capping layer comprise materials having different etch rates.

4. A method according to claim 1 wherein the second capping layer and the second interlayer dielectric film comprise materials having different etch rates.

5. A method according to claim 1 wherein the first capping layer comprises nitride and wherein the first interlayer dielectric film comprises oxide.

6. A method according to claim 1 wherein the step of forming a first interlayer dielectric film comprises the steps of:

forming an oxide film on the integrated circuit substrate, including on the cell array region and on the peripheral circuit region; and planarizing the oxide film to expose the first capping layer on the bit line.

7. A method according to claim 1 wherein the conductive material is tungsten or TiN.

8. A method according to claim 1 wherein the second capping layer comprises nitride and wherein the second interlayer dielectric film comprises oxide.

9. A method according to claim 4 wherein the step of forming a second interlayer dielectric film comprises the steps of:

forming an oxide film on the integrated circuit substrate, including on the cell array region and on the peripheral circuit region; and removing the oxide film from on the cell array region, using the second capping layer as an etch stop.

10. A method of forming an integrated circuit memory device comprising the steps of:

forming a plurality of memory cell transistors and a plurality of peripheral circuit transistors in a cell array region and in a peripheral circuit region, respectively, of an integrated circuit substrate;

forming at least one interlayer dielectric film on the integrated circuit substrate, including on the cell array region and on the peripheral circuit region, the at least one interlayer dielectric film including a bit line electrically connected to at least one of the memory cell transistors;

forming a capping layer on the at least one interlayer dielectric film;

forming a wiring layer directly on the capping layer, electrically connected to a peripheral circuit transistor in the peripheral circuit region;

forming a capacitor storage electrode directly on the capping layer, electrically connected to a memory cell transistor in the cell array region;

forming a capacitor dielectric film on the capacitor storage electrode; and forming a capacitor plate electrode on the capacitor dielectric film.

11. A method according to claim 10 wherein the following steps are performed between the steps of forming a capping layer and forming a wiring layer:

forming a first contact hole in the cell array region and a second contact hole in the peripheral circuit region, including through the capping layer; and simultaneously placing conductive material in the first and second contact holes, such that the conductive material in the first contact hole electrically contacts a memory cell transistor in the cell array region and the conductive material in the second contact hole electrically contacts a peripheral circuit transistor in the peripheral circuit region.

12. A method according to claim 11:

wherein the step of forming a wiring layer comprises the step of forming a wiring layer directly on the capping layer, electrically connected to the conductive material in the second contact hole; and wherein the step of forming a capacitor storage electrode comprises the step of forming a capacitor storage electrode directly on the second capping layer, electrically connected to the conductive material in the first contact hole.

13. A method according to claim 10 wherein the capping layer forming step comprises the step of forming a planar capping layer.

14. A method according to claim 11 wherein the step of simultaneously placing conductive material further comprises the step of forming conductive material on the capping layer; and wherein the step of forming a wiring layer comprises the step of patterning the conductive material on the capping layer.

* * * * *